US010622232B2

(12) United States Patent
Ha

(10) Patent No.: US 10,622,232 B2
(45) Date of Patent: Apr. 14, 2020

(54) SEMICONDUCTOR MANUFACTURING APPARATUS AND METHOD OF MANUFACTURING SEMICONDUCTOR DEVICE USING THE SAME

(71) Applicant: Samsung Electronics Co., Ltd., Suwon-si, Gyeonggi-do (KR)

(72) Inventor: Kyung Ho Ha, Asan-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 16/010,426

(22) Filed: Jun. 16, 2018

(65) Prior Publication Data

US 2019/0067059 A1  Feb. 28, 2019

(30) Foreign Application Priority Data

Aug. 23, 2017 (KR) .................. 10-2017-0106810

(51) Int. Cl.
*H01L 21/268* (2006.01)
*H01L 21/67* (2006.01)
(Continued)

(52) U.S. Cl.
CPC ...... *H01L 21/67288* (2013.01); *G06T 7/0004* (2013.01); *H01L 21/268* (2013.01); *H01L 21/304* (2013.01); *H01L 21/67115* (2013.01); *H01L 21/6835* (2013.01); *H01L 21/6836* (2013.01); *H01L 21/78* (2013.01);
(Continued)

(58) Field of Classification Search
CPC .............. H01L 27/146–14893; H01L 27/14603–14616; H01L 27/14618; H01L 27/1462–14623; H01L 27/14625–14629; H01L 27/1463; H01L 27/1464; H01L 27/14636; H01L 21/67288; H01L 21/268; H01L 21/304; H01L 23/544
See application file for complete search history.

(56) References Cited

U.S. PATENT DOCUMENTS 6,172,749 B1  1/2001  Watanabe
6,937,754 B1  8/2005  Eguchi
(Continued)

FOREIGN PATENT DOCUMENTS

JP  10142160 A  5/1998
JP  2001235430 A  8/2001
(Continued)

*Primary Examiner* — Dale E Page
*Assistant Examiner* — Wilner Jean Baptiste
(74) *Attorney, Agent, or Firm* — Renaissance IP Law Group LLP

(57) ABSTRACT

A semiconductor manufacturing apparatus and a method of manufacturing semiconductor device are provided. The semiconductor manufacturing apparatus includes a loading unit configured to load a wafer having a first surface to which a die attach film is attached through an ultraviolet sensitive layer, an ultraviolet light source configured to irradiate ultraviolet light onto the first surface of the wafer attached to the die attach film to weaken adhesive strength of the ultraviolet sensitive layer, and a camera configured to generate a wafer image by capturing ultraviolet light transmitted through a second surface of the wafer opposite to the first surface of the wafer.

16 Claims, 18 Drawing Sheets

(51) Int. Cl.
*H01L 23/544* (2006.01)
*H01L 21/66* (2006.01)
*H01L 21/304* (2006.01)
*G06T 7/00* (2017.01)
*H01L 21/78* (2006.01)
*H01L 21/683* (2006.01)
*B24B 37/005* (2012.01)
*B23K 26/364* (2014.01)
*B23K 101/40* (2006.01)

(52) U.S. Cl.
CPC ............ *H01L 22/12* (2013.01); *H01L 23/544* (2013.01); *B23K 26/364* (2015.10); *B23K 2101/40* (2018.08); *B24B 37/0053* (2013.01); *G06T 2207/10144* (2013.01); *G06T 2207/20221* (2013.01); *G06T 2207/30148* (2013.01); *H01L 21/67092* (2013.01); *H01L 2221/68327* (2013.01); *H01L 2223/5446* (2013.01)

(56) References Cited

U.S. PATENT DOCUMENTS

| | | | |
|---|---|---|---|
| 8,379,964 B2 | 2/2013 | Janssens et al. | |
| 2009/0121337 A1* | 5/2009 | Abe | H01L 21/67092 257/686 |
| 2010/0261337 A1* | 10/2010 | Huang | H01L 21/78 438/464 |
| 2014/0168635 A1 | 6/2014 | Lin et al. | |
| 2016/0315002 A1* | 10/2016 | Komatsu | H01L 21/67288 |

FOREIGN PATENT DOCUMENTS

| | | |
|---|---|---|
| JP | 3775861 B2 | 5/2006 |
| JP | 2007244705 A | 9/2007 |
| JP | 4332933 B2 | 9/2009 |
| JP | 4575886 B2 | 11/2010 |
| JP | 5192547 B2 | 5/2013 |
| JP | 2013137257 A | 7/2013 |
| JP | 5521283 B2 | 6/2014 |
| KR | 1530009 A | 6/2010 |

* cited by examiner

SEMICONDUCTOR MANUFACTURING APPARATUS AND METHOD OF MANUFACTURING SEMICONDUCTOR DEVICE USING THE SAME

CROSS-REFERENCE TO RELATED APPLICATION

This application claims priority from Korean Patent Application No. 10-2017-0106810 filed on Aug. 23, 2017 in the Korean Intellectual Property Office, and all the benefits accruing therefrom under 35 U.S.C. 119, the contents of which are incorporated herein by reference in its entirety.

BACKGROUND

1. Technical Field

The present disclosure relates to a semiconductor manufacturing apparatus and a method of manufacturing a semiconductor device using the same.

2. Description of the Related Art

Various physical and chemical loads are applied to a wafer in a semiconductor manufacturing process. Particularly in a semiconductor packaging process, a back lap (B/L) process, a grind after laser (GAL) process or the like causes a physical impact on a wafer to process the surface of a semiconductor device. Accordingly, a defect such as a crack may occur in the wafer.

In recent years, there has been an increase in the demand for thin wafers, and according to the development trend of products, both the demand for thin wafers and the possibility of occurrence of physical defects on the wafer are also increasing. Various inspection techniques are presented which can detect a defect occurring on the wafer and eliminate a defective semiconductor device.

SUMMARY

According to an aspect of the present inventive concept, a semiconductor manufacturing apparatus includes a loading unit configured to load a wafer having a first surface to which a die attach film is attached through an ultraviolet sensitive layer, an ultraviolet light source configured to irradiate ultraviolet light onto the first surface of the wafer attached to the die attach film to weaken adhesive strength of the ultraviolet sensitive layer, and a camera configured to generate a wafer image by capturing ultraviolet light transmitted through a second surface of the wafer opposite to the first surface of the wafer.

According to another aspect of the present inventive concept, a semiconductor manufacturing apparatus includes an ultraviolet light source configured to irradiate ultraviolet light onto a first surface of a wafer on which a plurality of semiconductor devices separated by a scribe region are formed and to which a die attach film is attached through an ultraviolet sensitive layer to deform the ultraviolet sensitive layer, a camera configured to generate a wafer image by capturing an image formed by ultraviolet light transmitted through a second surface of the wafer opposite to the first surface of the wafer, and an image processing unit configured to receive the wafer image and determine whether a defect exists in the semiconductor devices from the wafer image.

According to another aspect of the present inventive concept, a method of manufacturing a semiconductor device includes providing a wafer on which a plurality of semiconductor devices are separated by a scribe region, attaching a die attach film having an ultraviolet sensitive layer to a first surface of the wafer and loading the wafer on the loading unit, irradiating ultraviolet light onto the first surface of the wafer to cure the ultraviolet sensitive layer, and obtaining an image of the wafer by capturing ultraviolet light transmitted through a second surface of the wafer opposite to the first surface of the wafer.

According to another aspect of the present inventive concept, a semiconductor manufacturing apparatus for performing defect inspection on a wafer on which a plurality of semiconductor devices separated by a scribe region are formed is disclosed. The wafer can be characterized as including a first surface, to which a die attach film is attached through an ultraviolet sensitive layer, and a second surface opposite to the first surface. The semiconductor manufacturing apparatus includes a grinder configured to grind the second surface of the wafer, an ultraviolet light source configured to irradiate ultraviolet light onto the first surface of the wafer to deform the ultraviolet sensitive layer, a camera configured to generate a wafer image by capturing an image formed by ultraviolet light transmitted through the second surface of the wafer, and an image processing unit configured to receive the wafer image and determine whether a defect exists in the semiconductor devices from the wafer image.

In some embodiments, a method of manufacturing a semiconductor device, comprising: providing a wafer on which a plurality of semiconductor devices are separated by a scribe region, the wafer having a die attach film attached to a first surface of the wafer through an ultraviolet sensitive layer; loading the wafer on a loading unit; irradiating the first surface of the wafer with ultraviolet light to cure the ultraviolet sensitive layer and to transmit through a scribe region and cracks, if any, in the wafer; and detecting defects in the wafer using the ultraviolet light transmitted through a second surface of the wafer opposite to the first surface of the wafer.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Hereinafter, a semiconductor manufacturing apparatus and a semiconductor manufacturing method using the same according to some embodiments of the present inventive concept will be described with reference to FIGS. 1 to 13.

Figure 1:
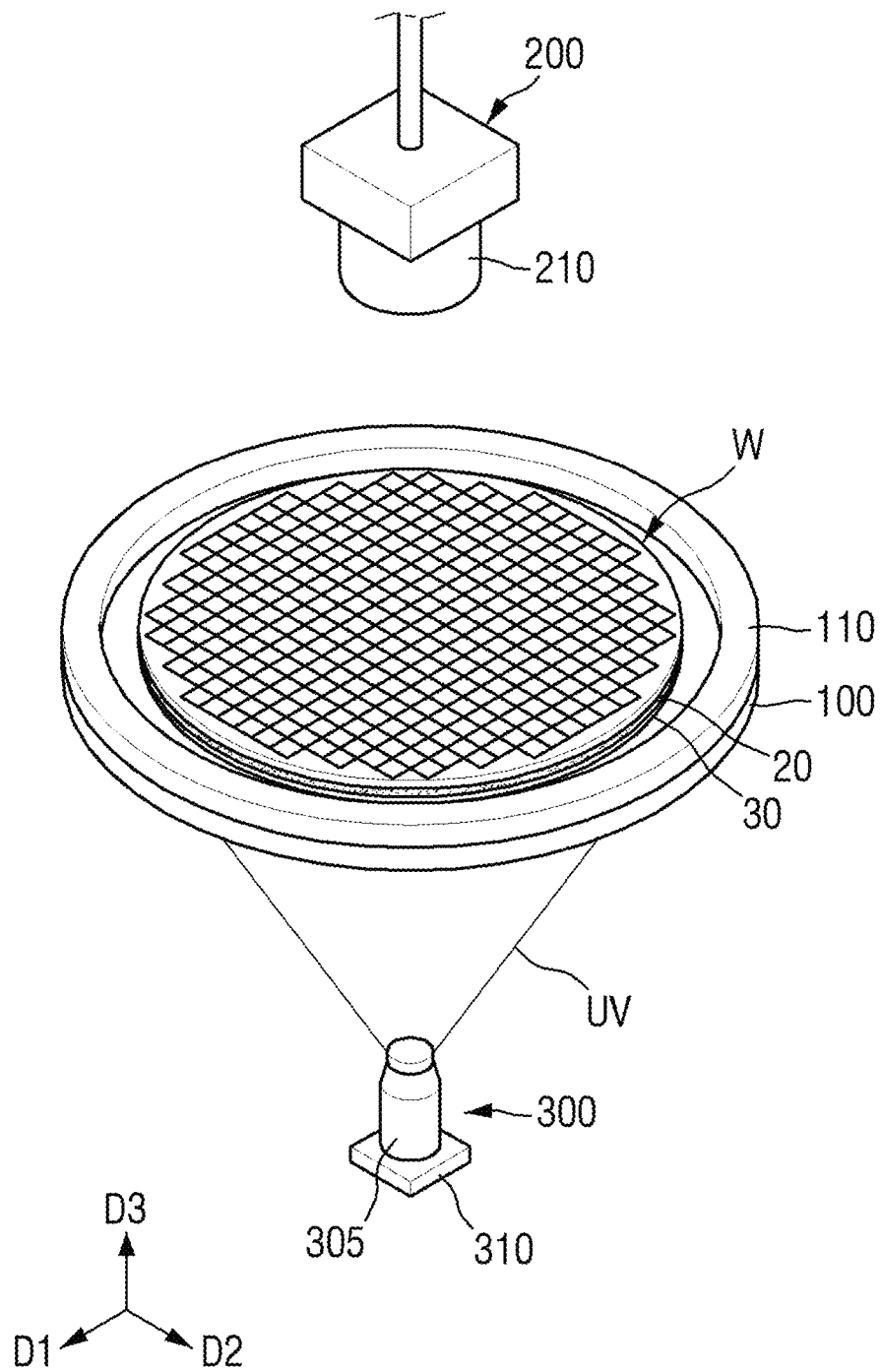
FIG. 1 is a perspective view of a semiconductor manufacturing apparatus according to an exemplary embodiment of the present inventive concept.

FIG. 1 is a perspective view of a semiconductor manufacturing apparatus according to an exemplary embodiment of the present inventive concept. FIG. 2 is a conceptual diagram explaining the semiconductor manufacturing apparatus of FIG. 1.

Figure 2A:
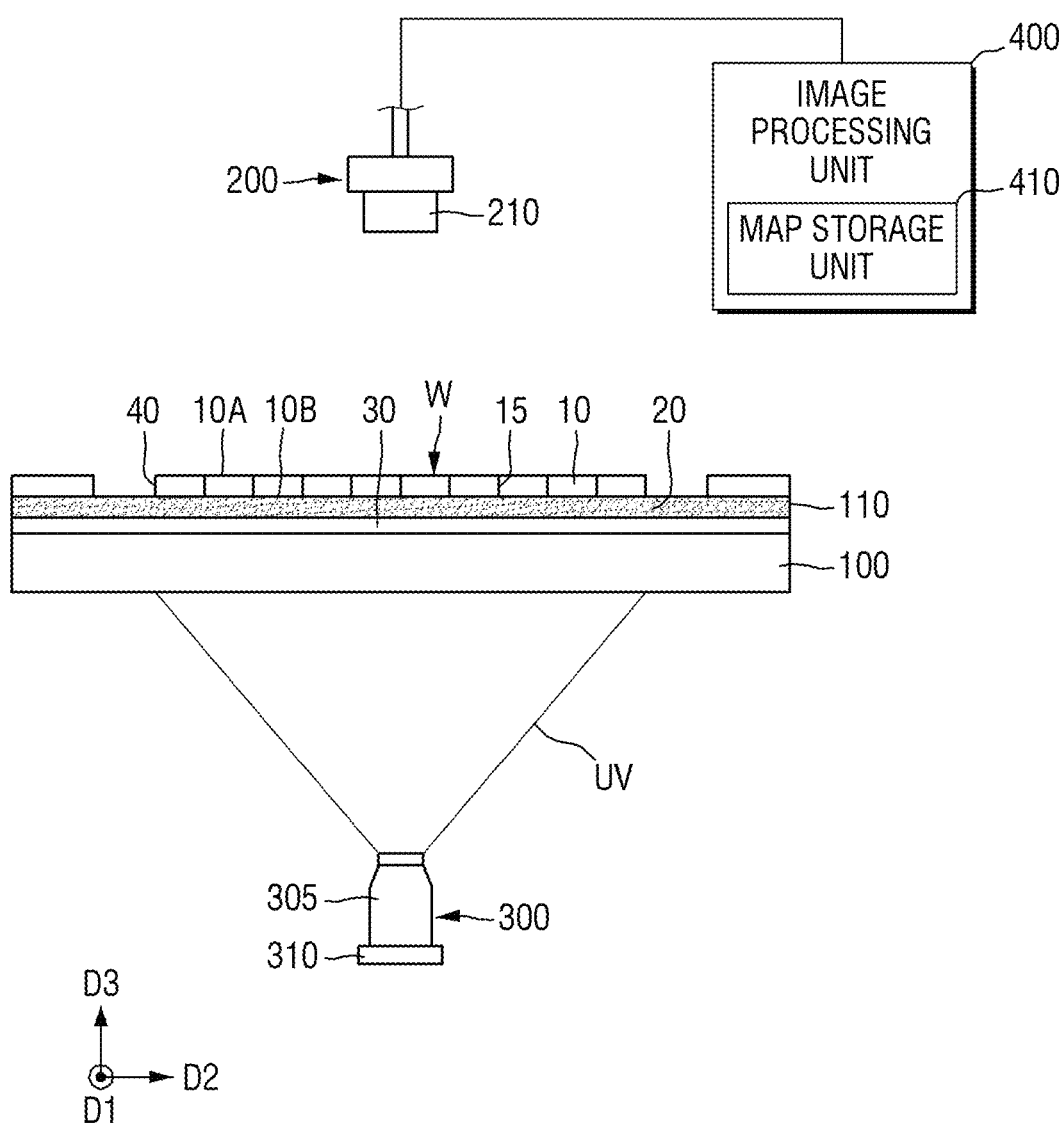
FIGS. 2A-2B are conceptual diagrams explaining a semiconductor manufacturing apparatus according to some embodiments of the present disclosure.
Figure 2B:
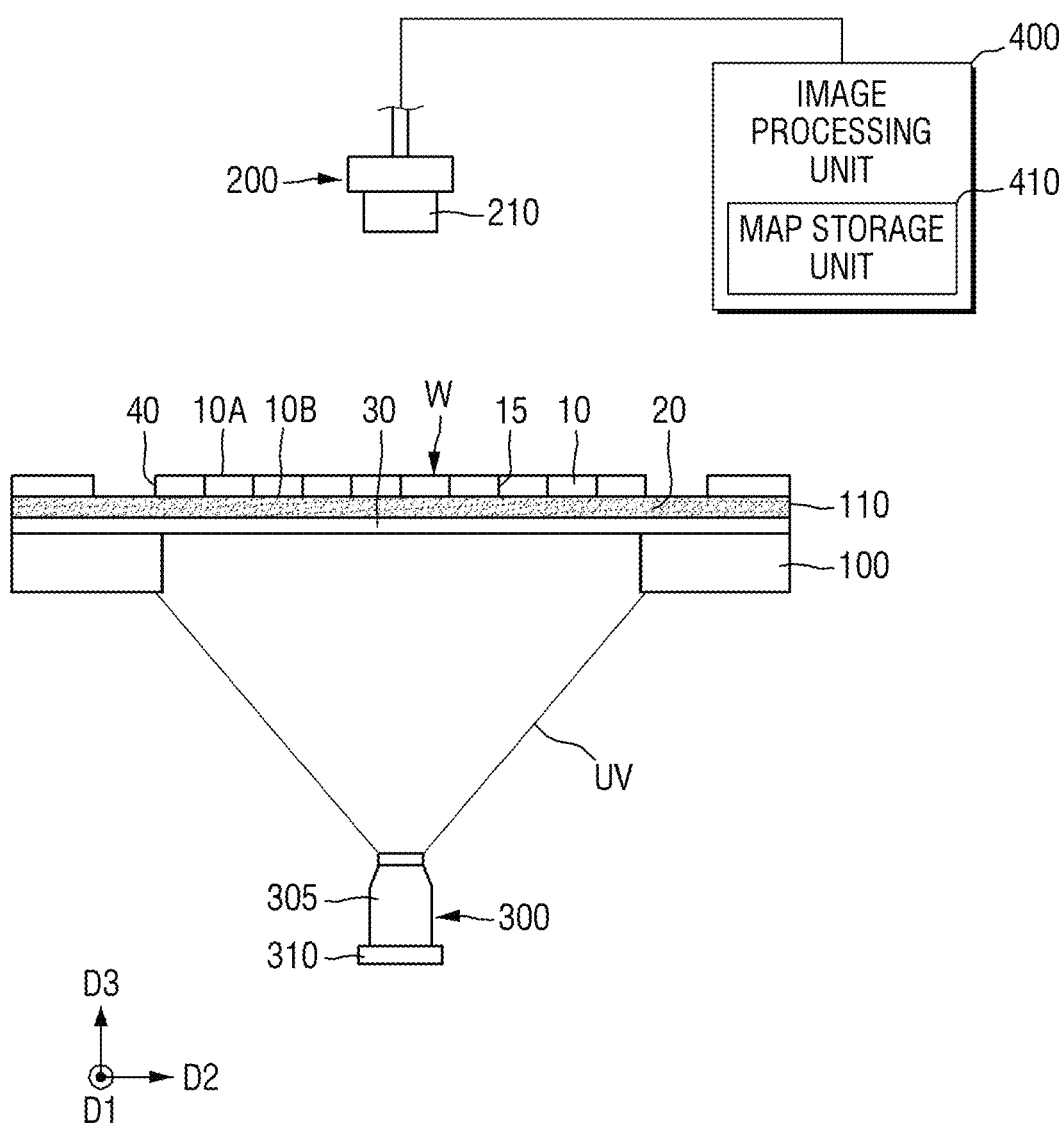

Referring to FIGS. 1 and 2A-2B, a semiconductor manufacturing apparatus according to an exemplary embodiment of the present inventive concept may include a loading unit 100, an optical device such as a camera 200, an ultraviolet light source 300, an image processing unit 400 and the like.

The loading unit 100 may load the wafer W thereon. The loading unit 100 may include a transparent material that transmits ultraviolet light (UV) emitted from the ultraviolet light source 300. In the exemplary embodiment, the transparent material may include glass, but the present inventive concept is not limited thereto.

In some other embodiments, as shown in FIG. 2B, the loading unit 100 may support only a partial region adjacent to an outer periphery 40 of a wafer W such that a surface of a die attach film 30 attached to the wafer W is exposed to the ultraviolet light source 300.

The wafer W loaded on the loading unit 100 may include a plurality of semiconductor devices 10 separated by a scribe region 15. In some embodiments, the wafer W may include a damaged layer formed by irradiating a laser beam along the scribe region 15. The damaged layer is formed by physical damage to the wafer W to allow a chip expanding or sawing process for separating the semiconductor devices 10 thereafter.

The wafer W may be attached to the die attach film 30 on which an ultraviolet sensitive layer 20 is formed. Since the thickness of the wafer W is very thin, ranging from several tens of micrometers (μm) to several hundreds of micrometers (μm), in order to prevent the wafer W from warping during a semiconductor device manufacturing process, a sufficient thickness of wafer W can be ensured through adhesion with the die attach film 30.

The die attach film 30 may include, but is not limited to, a transparent material such as a polypropylene (PP) film, an epoxy film, a polyimide film, or a polyethylene terephthalate (PET) film.

The ultraviolet sensitive layer 20 may provide adhesive strength for bonding the wafer W and the die attach film 30. The adhesive strength of the ultraviolet sensitive layer 20 may be weakened by changing its physical properties by ultraviolet irradiation. Particularly, the adhesive strength may be weakened by the ultraviolet light (UV) emitted from the ultraviolet light source 300 of the semiconductor manufacturing apparatus according to some embodiments of the present disclosure.

That is, it is necessary to separate the semiconductor devices 10 from the die attach film 30 in order to perform a die attach process after the completion of the chip expanding or sawing process. As the adhesive strength of the ultraviolet sensitive layer 20 irradiated with ultraviolet rays becomes weak, the semiconductor devices 10 can be easily separated from the die attach film 30. The ultraviolet sensitive layer 20 may include, for example, an acrylic resin that is cured by irradiation with ultraviolet rays, but is not limited thereto.

Similarly to the die attach film 30, since the ultraviolet sensitive layer 20 includes a transparent material, the ultraviolet light (UV) emitted from the ultraviolet light source 300 can reach a first surface 10A of the wafer W.

In the present specification, in both surfaces of the wafer W, a surface to which the die attach film 30 is attached and which is loaded so as to face the loading unit 100 is referred to as the first surface 10A of the wafer W and the opposite surface thereof is referred to as a second surface 10B of the wafer W.

In an exemplary embodiment, a ring mount 110 may be attached together with the wafer W onto the die attach film 30. The ring mount 110 may be disposed on the die attach film 30 so as to surround the outer periphery 40 of the wafer W and be spaced apart from the outer periphery 40 of the wafer W by a predetermined distance. The ring mount 110 can prevent warpage of the wafer W that occurs in the subsequent chip expanding or sawing process.

The ultraviolet light source 300 may be disposed on a lower surface of the loading unit 100 on which the wafer W is mounted. The ultraviolet light source 300 may irradiate ultraviolet light onto the wafer W and the die attach film 30. The ultraviolet light (UV) emitted from the ultraviolet light source 300 may weaken the adhesive strength between the wafer W and the die attach film 30 and may allow defect inspection of the surface of the wafer W by image capturing using the camera 200.

The ultraviolet light source 300 may include a lamp 310 that generates ultraviolet light (UV). The lamp 310 may include, for example, a cold cathode fluorescent lamp (CCFL) or a light emitting diode (LED) lamp, but is not limited thereto. The lamp 310 may generate ultraviolet light (UV) in an ultraviolet range, i.e., in a wavelength range of 10 to 400 nm.

In an exemplary embodiment, the ultraviolet light source 300 may include a lens 305 that diffuses the ultraviolet light generated from the lamp 310 to substantially the entire surface of the wafer W. The ultraviolet light (UV) that has passed through the lens 305 may be irradiated onto substantially the entire surface of the wafer W or the die attach film 30.

Assuming the surface of the wafer W on which the die attach film 30 is attached is the first surface 10A, the camera 200 may be disposed above the second surface 10B that is the opposite surface of the first surface 10A. The camera 200 may generate an image of the wafer W by capturing the ultraviolet light transmitted through the second surface of the wafer W.

The camera 200 may include a charge-coupled device (CCD) image sensor or a complementary metal oxide semiconductor (CMOS) image sensor that converts an optical signal supplied to the lens 210 into an electrical signal. In an exemplary embodiment, the camera 200 may further include a filter for transmitting light in a wavelength band of 10 to 400 nm emitted by the ultraviolet light source 300.

As the ultraviolet light source 300 irradiates substantially the entire area of the first surface 10A of the wafer W with ultraviolet light (UV), the camera 200 may generate an image of the wafer W by capturing an image of substantially the entire second surface 10B of the wafer W.

The camera 200 may be connected to the image processing unit 400. The image processing unit 400 may process an image of the wafer W generated by the camera 200. For example, the image processing unit 400 may synthesize images of different regions on the wafer W to generate one image. A detailed description thereof will be given later.

The image processing unit 400 may include, for example, at least one central processing unit (CPU), a graphic processing unit (GPU), or an application processor (AP), but is not limited thereto. Alternatively, the image processing unit 400 may include a device implemented by a special-purpose logic circuit such as a field programmable gate array (FPGA) or an application specific integrated circuit (ASIC).

In some implementations, the image processing unit 400 may include a map storage unit 410. The map storage unit 410 may store map data indicating whether the wafer W is defective. In the exemplary embodiment, the map data may include information on the position of the defective semiconductor device 10, the kind of the defect, and the like in the manufacturing process of the semiconductor devices 10.

The map storage unit 410 may be a nonvolatile storage medium such as a solid state drive (SSD) or a hard disk drive (HDD), or a volatile storage medium such as a dynamic random access memory (DRAM).

If the map data including defect information on the wafer W in the previous process is provided to the image processing unit 400, the image processing unit 400 stores the map data in the map storage unit 410. Thereafter, when the camera 200 generates an image of the wafer W, the image processing unit 400 may store map data on whether the semiconductor device 10 is defective based on the generated image, and store the map data in the map storage unit 410 again. Then, the image processing unit 400 may provide the map data stored in the map storage unit 410 in a subsequent process.

Figure 3:
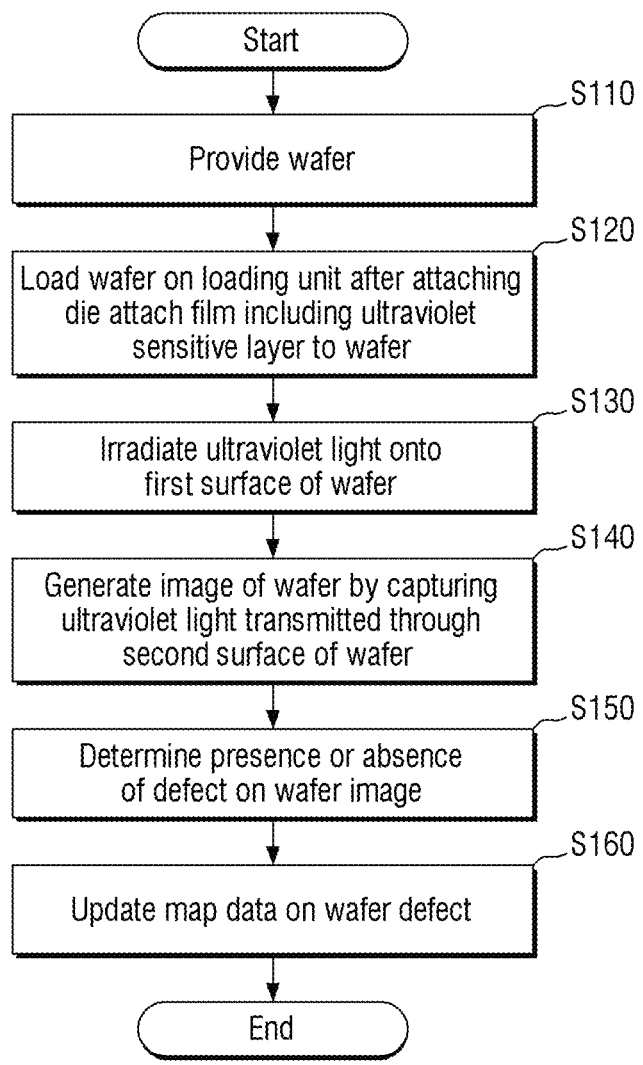
FIG. 3 is a flowchart explaining an operation of a semiconductor manufacturing apparatus according to an exemplary embodiment of the present inventive concept.

FIG. 3 is a flowchart explaining an operation of a semiconductor manufacturing apparatus according to an exemplary embodiment of the present inventive concept.

Referring to FIG. 3, a method of manufacturing a semiconductor device using a semiconductor manufacturing apparatus according to an exemplary embodiment of the present inventive concept includes providing a wafer W in which a plurality of semiconductor devices 10 are separated by the scribe region 15 (S110), attaching the die attach film 30 including the ultraviolet sensitive layer 20 to the wafer W and loading it on the loading unit 100 (S120), irradiating ultraviolet light (UV) onto the first surface of the wafer W (S130), generating an image of the wafer W by capturing ultraviolet light transmitted through the second surface of the wafer W (S140), determining the presence or absence of a defect in the image of the wafer W (S150), and updating the map data to indicate whether the wafer W is defective (S160).

First, the wafer W in which a plurality of semiconductor devices 10 are separated by the scribe region 15 is provided (S110). In an exemplary embodiment, the first surface of the wafer W may be subjected to grinding. That is, after physical damage is generated in the scribe region 15 by the laser, the wafer W may be subjected to a grind after laser (GAL) process or a back lap (B/L) process to reduce the thickness of the wafer.

Then, the die attach film 30 including the ultraviolet sensitive layer 20 is attached to the wafer W and loaded on the loading unit 100 (S120). Since the wafer W is attached to the die attach film 30, the thickness can be secured to prevent the warp phenomenon. The adhesive strength of the ultraviolet sensitive layer 20 may be weakened by the subsequent ultraviolet light (UV) irradiation process.

Next, the ultraviolet light source 300 irradiates ultraviolet light (UV) onto the first surface of the wafer W (S130). The ultraviolet light (UV) irradiated on the first surface of the wafer W may reach the die attach film 30 and the ultraviolet sensitive layer 20 through the loading unit 100. In an exemplary embodiment, the ultraviolet light source 300 may irradiate ultraviolet light (UV) onto substantially the entire surface of the first surface of the wafer W. The ultraviolet sensitive layer 20 may be deformed by the irradiated ultraviolet light (UV), which may weaken the adhesive strength between the wafer W and the die attach film 30.

As described above, the ultraviolet light (UV) arriving at the loading unit 100 may reach the first surface of the wafer W after passing through the die attach film 30 and the ultraviolet sensitive layer 20.

Next, the camera 200 captures an image of the wafer by ultraviolet light (UV) transmitted through the second surface of the wafer W (S140).

The wafer W including a circuit structure formed therein may block ultraviolet light (UV) irradiated on the first surface. That is, the semiconductor devices 10 shown in the image of the wafer W captured by the camera 200 may have brightness less than a predetermined value.

However, in the case of the scribe region 15, where physical damage is caused by a laser or the like, at least a part of the ultraviolet light (UV) is transmitted or diffracted, so that the camera 200 can recognize the ultraviolet light (UV). Therefore, when the camera 200 captures an image of the second surface of the wafer W, an image may be generated in which a portion of the semiconductor device 10 is relatively dark and the scribe region 15 is relatively bright.

Subsequently, the image processing unit 400 determines whether a defect of the wafer W has exists based on the image generated by the camera 200 (S150).

The ultraviolet light (UV) transmitted through the wafer W may generate an image in which the scribe region 15 is relatively bright, and a portion where a crack has exists in the wafer W is also relatively bright.

Figure 4A:
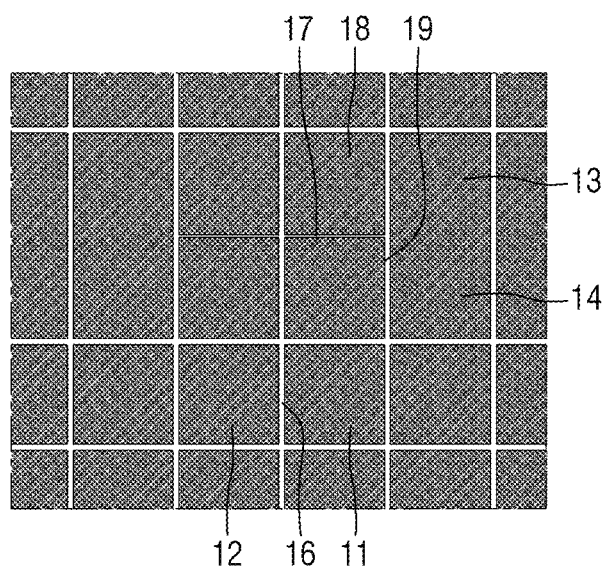
FIGS. 4A and 4B illustrate examples of a defect in a semiconductor device that can be detected by a semiconductor manufacturing apparatus according to an exemplary embodiment of the present inventive concept.
Figure 4B:
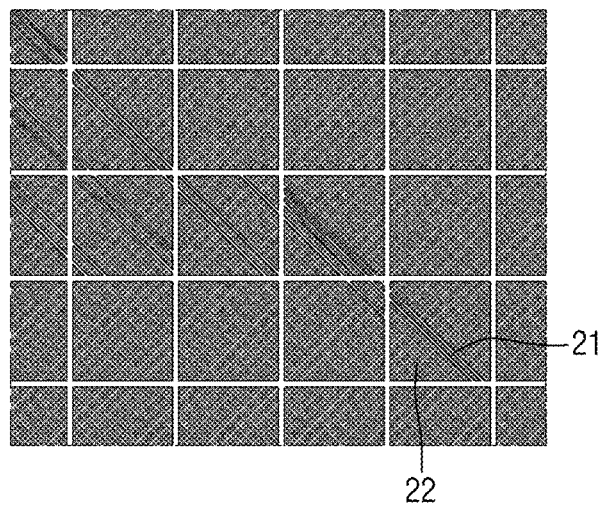

FIGS. 4A and 4B illustrate examples of a defect in a semiconductor device that can be detected by a semiconductor manufacturing apparatus according to an exemplary embodiment of the present inventive concept.

Referring to FIG. 4A, a defect on the wafer W that can be recognized based on the image captured by the camera 200 is illustrated. A plurality of semiconductor devices including a first semiconductor device 11, a second semiconductor device 12, a third semiconductor device 13, a fourth semiconductor device 14, a fifth semiconductor device 18, and a sixth semiconductor device 19 are formed on the wafer W.

In an exemplary embodiment, the image processing unit 400 may recognize that the brightness of a scribe region 16 between the first semiconductor device 11 and the second semiconductor device 12 is equal to or greater than a predetermined brightness value and determine that the scribe region 16 is normal.

However, since the scribe region between the third semiconductor device 13 and the fourth semiconductor device 14 is not displayed on the wafer image, the image processing unit 400 cannot recognize it. In this case, the image processing unit 400 determines that the third semiconductor device 13 and the fourth semiconductor device 14 have incomplete formation of the scribe region (or improperly scribed region), and a defect exists in which the third semiconductor device 13 and the fourth semiconductor device 14 are not separated. In an exemplary embodiment, it may be recognized that the third semiconductor device 13 and the fourth semiconductor device 14 are not subjected to damage from the laser, or are not sufficiently separated by the sawing process.

Further, the scribe region 17 between the fifth semiconductor device 18 and the sixth semiconductor device 19 in the wafer image is displayed such that the brightness thereof is lower than a predetermined brightness value. In this case, the image processing unit 400 may also determine that the formation of the scribe region 17 between the fifth semiconductor device 18 and the sixth semiconductor device 19 is incomplete and a defect exists in the fifth semiconductor device 18 and the sixth semiconductor device 19.

That is, if the brightness of the scribe region between two different semiconductor devices shown in the wafer image is less than a predetermined brightness value, the image processing unit 400 may determine that a defect exists in which the separation of the two semiconductor devices is incomplete.

Referring to FIG. 4B, a defect on the wafer W that can be recognized based on the image captured by the camera 200 is illustrated. A plurality of semiconductor devices including the semiconductor device 22 are formed on the wafer W.

As described above, if an internal image of the semiconductor devices 10 in the scribe region on the wafer image has a brightness less than a predetermined value, the image processing unit 400 may determine that no crack is generated in the semiconductor devices 10. However, if the wafer image includes, in the semiconductor devices 10, a pattern or a point which is displayed with a brightness of a predetermined value or more, the image processing unit 400 may determine that a crack defect exists in the semiconductor devices 10.

Based on a pattern 21 having a brightness of a predetermined value or more, which is displayed on the wafer image shown in FIG. 4B, the image processing unit 400 may determine that a crack defect exists in the semiconductor device 22.

In an exemplary embodiment of the present disclosure, a chip expanding operation may be performed before capturing an image of the surface of the wafer W. That is, a plurality of semiconductor devices 10 can be separated by stretching the die attach film 30 to which the wafer W is attached in a circumferential direction of the wafer W. In an exemplary embodiment, the chip expansion may be performed while maintaining the wafer W at a low temperature.

When the chip expanding is performed on the wafer W, a scribe region for separating a plurality of semiconductor devices 10 formed on the wafer W or a crack region formed in the semiconductor device 10 may be further expanded. Accordingly, it possible to increase the diffraction of light transmitted through the scribe region or the crack region to facilitate the image capturing of the surface of the wafer W by the camera 200 and the defect determination by the image processing unit 400.

Then, the image processing unit 400 may update the map data of the wafer W (S160).

Figure 5A:
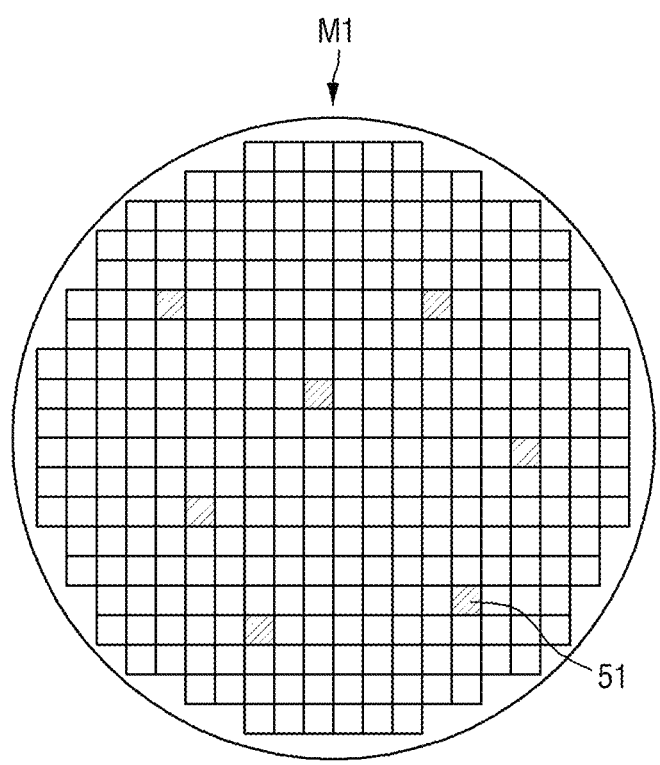
FIG. 5A and FIG. 5B are conceptual diagrams explaining the update of map data using a detected semiconductor device defect provided by a semiconductor manufacturing apparatus according to an exemplary embodiment of the present inventive concept.
Figure 5B:
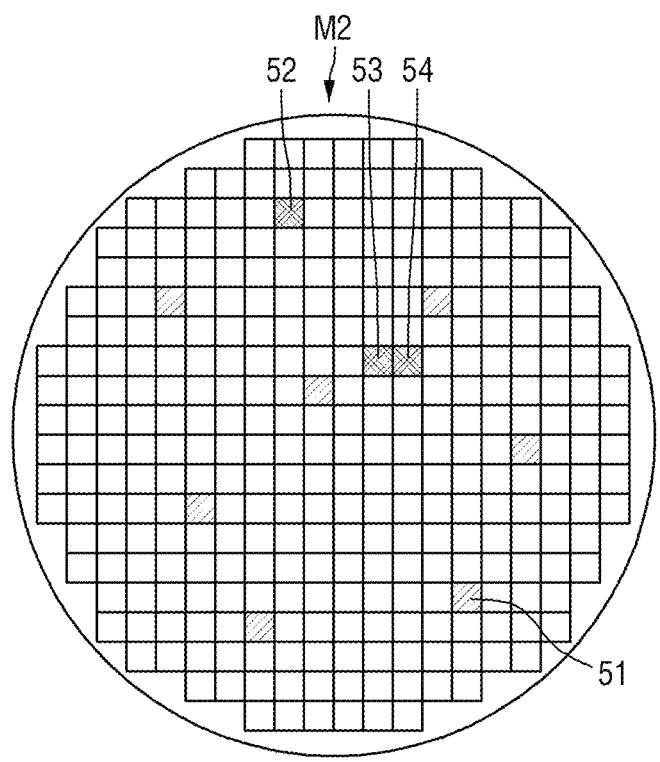

FIG. 5A and FIG. 5B are conceptual diagrams explaining the update of map data using a detected semiconductor device defect provided by a semiconductor manufacturing apparatus according to an exemplary embodiment of the present inventive concept.

Referring to FIG. 5A, the image processing unit 400 may receive first map data M1 generated in a previous process performed on the wafer W, and store the first map data M1 in the map storage unit 410. The first map data M1 may include information regarding a first defective semiconductor device 51 among a plurality of semiconductor devices included on the wafer W. The first map data M1 may be, for example, an image as shown in FIG. 5A, but is not limited thereto. Alternatively, the first map data M1 may include a data structure in the form of a table.

Referring to FIG. 5B, an exemplary embodiment of second map data M2, in which the image processing unit 400 has added defect information of the wafer W that is newly recognized by the image processing unit 400, is illustrated. The second map data M2 may include information regarding the first defective semiconductor device 51 included in the first map data M1 and information on defects regarding newly added second defective semiconductor device 52, third defective semiconductor device 53, and fourth defective semiconductor device 54. For example, the second defective semiconductor device 52 may have a crack defect, while the third defective semiconductor device 53 and fourth defective semiconductor device 54 may have a defect such that they are not sufficiently separated by the scribe region.

The image processing unit 400 may determine whether there is a defect on the wafer W based on the wafer image formed from the camera 200 and update the first map data M1. In the exemplary embodiment, the image processing unit 400 may read the first map data M1 stored in the map storage unit 410, generate the second map data M2 by adding the defect information of the wafer W determined based on the wafer image formed from the camera 200 to the first map data M1, and store the second map data M2 in the map storage unit 410 again.

Through the above-described process, an inspection process of a defect occurring in the semiconductor devices 10 or the wafer W may be performed at the same time while performing the semiconductor manufacturing method, which is a preliminary operation necessary for separating the semiconductor devices 10 from the die attach film 30.

In the semiconductor device manufacturing process, throughput (a term indicating the number of wafers W that can be processed for a predetermined time) is an important indicator in determining productivity. In the semiconductor device manufacturing process performed by a semiconductor manufacturing apparatus according to an exemplary embodiment of the present inventive concept, through irradiation using the ultraviolet light source 300, it is possible to weaken the adhesive strength of the ultraviolet sensitive layer 20 and inspect a crack or non-separation defect occurring on the surface of the wafer W. Therefore, the throughput of the semiconductor manufacturing process can be improved.

Figure 6A:
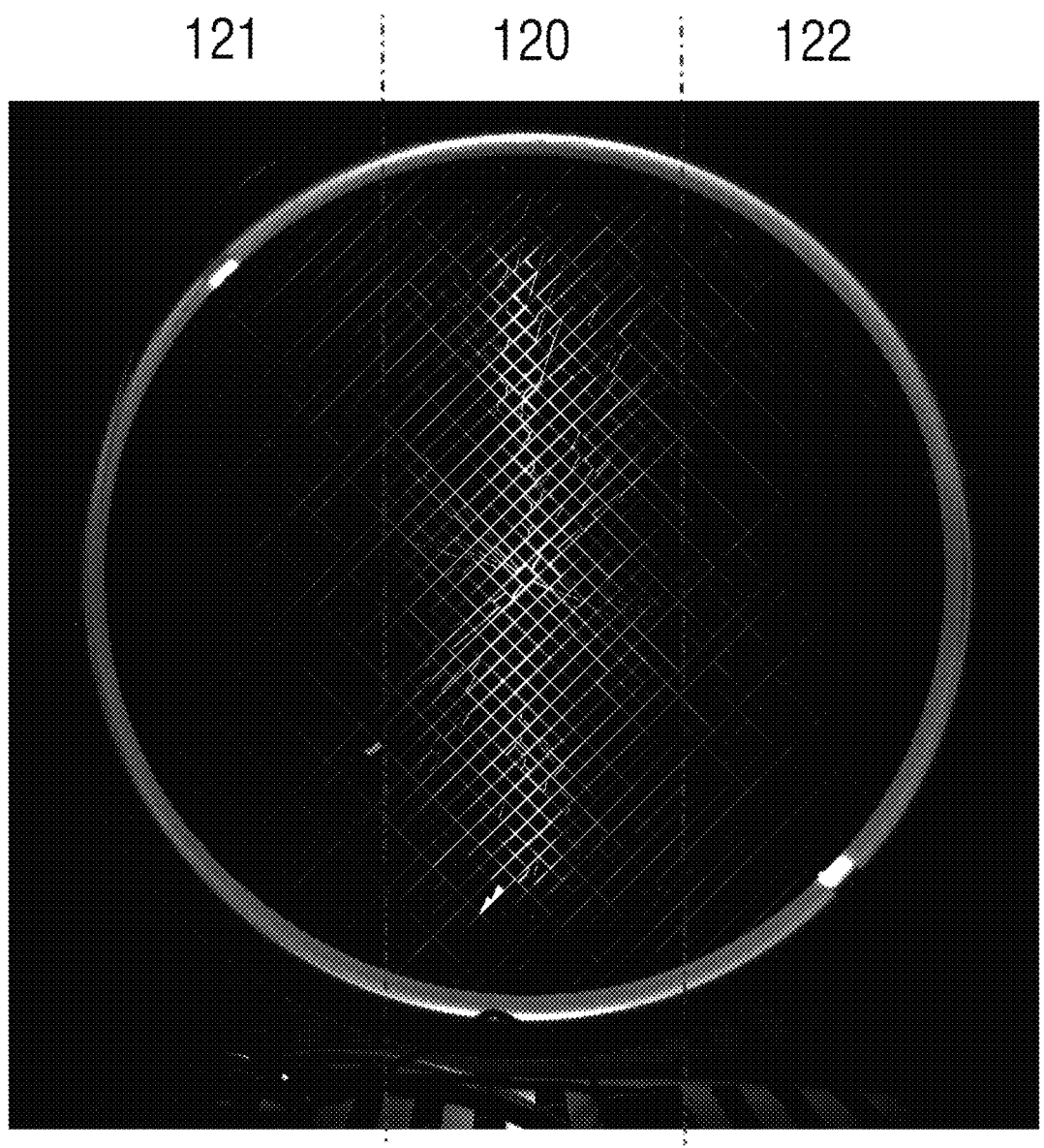
FIGS. 6A to 6C show wafer images generated with different exposure times by a semiconductor manufacturing apparatus according to an exemplary embodiment of the present inventive concept.
Figure 6B:
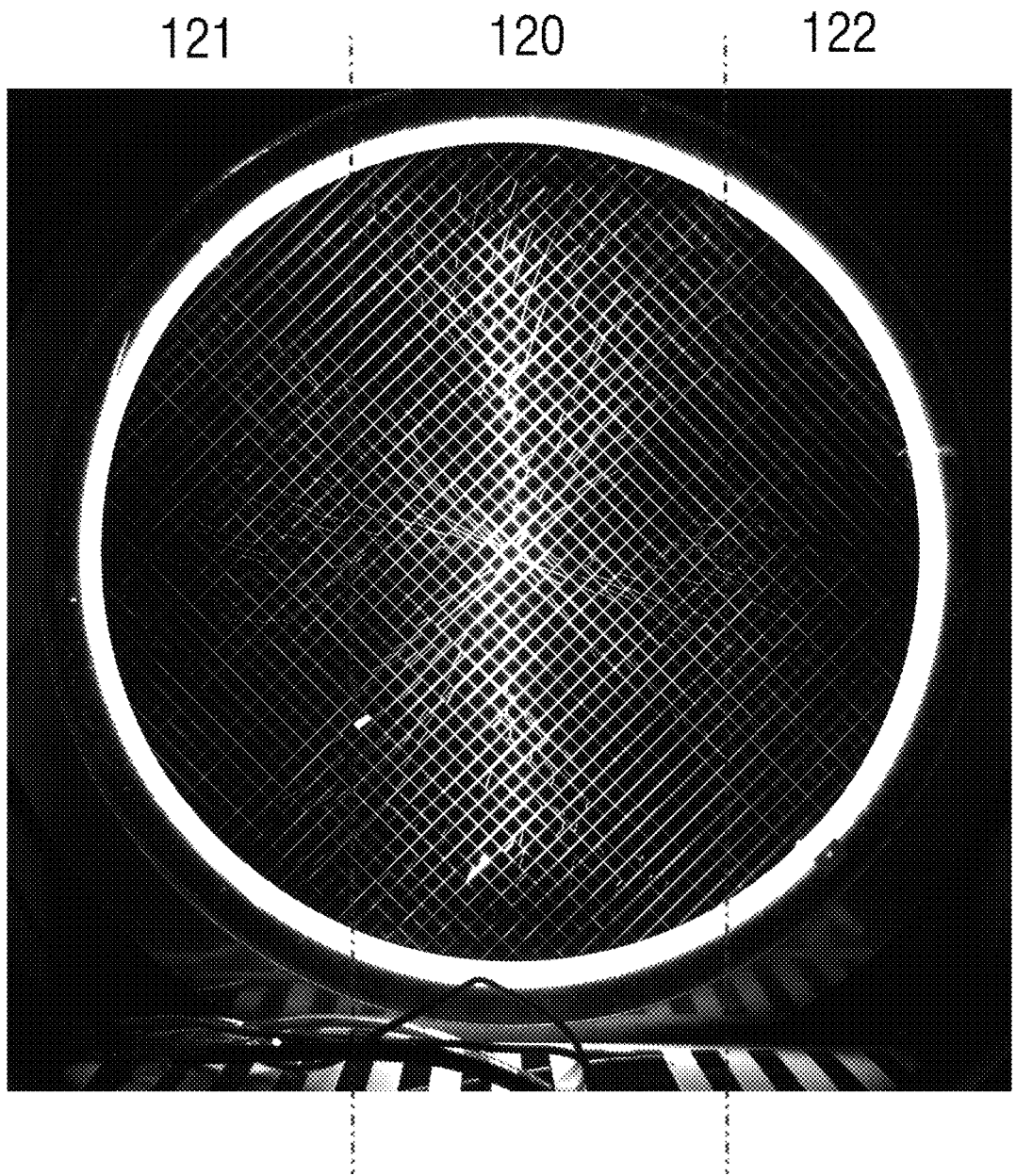
Figure 6C:
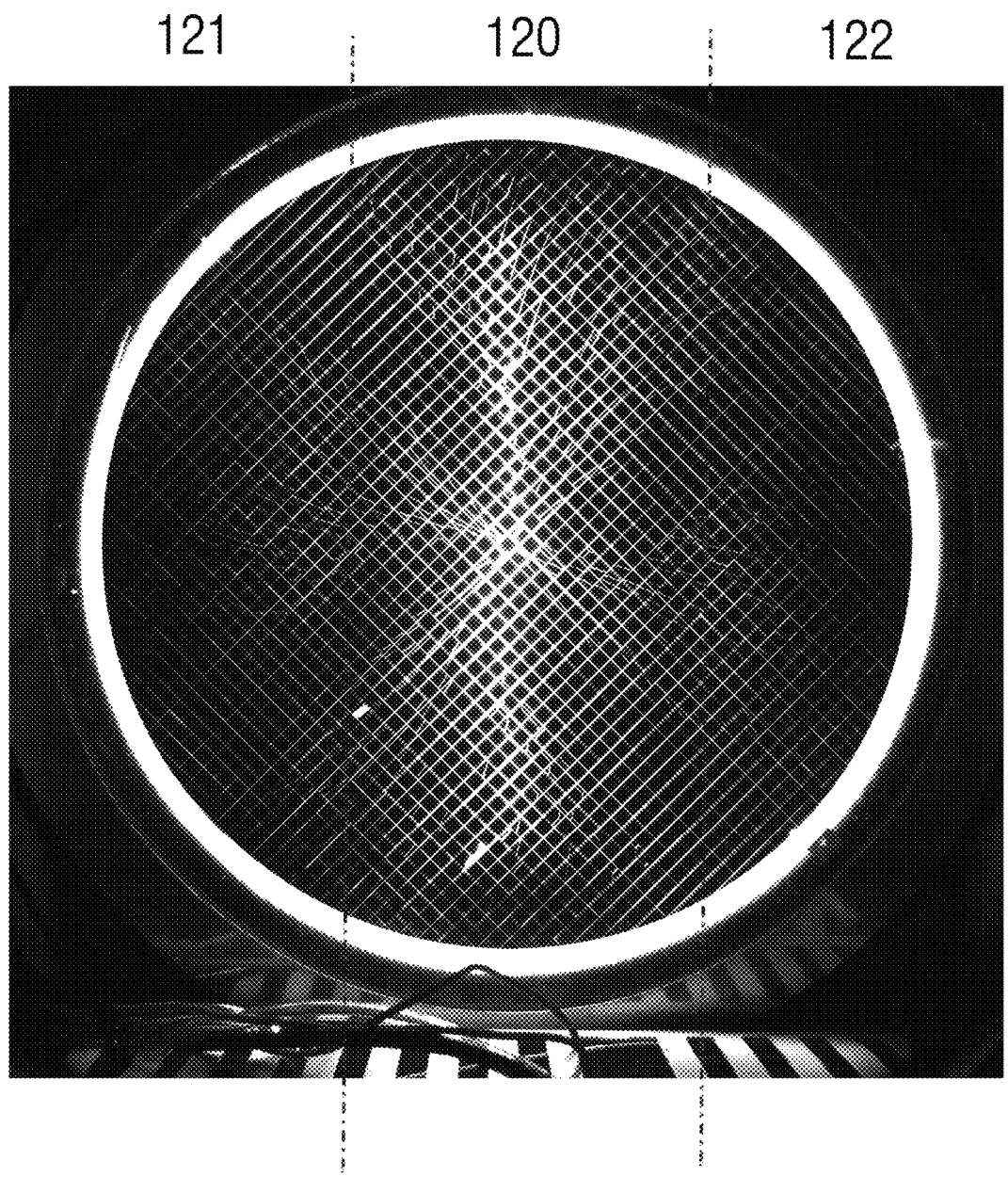

FIGS. 6A to 6C show wafer images generated with different exposure times by a semiconductor manufacturing apparatus according to an exemplary embodiment of the present inventive concept.

The semiconductor manufacturing apparatus according to an exemplary embodiment of the present inventive concept may capture and generate a plurality of images for the wafer W. In the exemplary embodiment, the camera 200 may generate a first image of the wafer W with a first exposure time and a second image of the wafer W with a second exposure time different from the first exposure time. FIG. 6A is a first image of the wafer W captured with the first exposure time, FIG. 6B is a second image of the wafer W captured with the second exposure time, and FIG. 6C is a third image of the wafer W captured with the third exposure time by the camera 200. The third exposure time is longer than the second exposure time, and the second exposure time is longer than the first exposure time. Thus, the third image of FIG. 6C is brighter than the second image of FIG. 6B, and the second image of FIG. 6B is brighter than the first image of FIG. 6A.

The image processing unit 400 may select one of a plurality of images captured with different exposure times by the camera 200 to determine the selected image as a wafer image. For example, the image processing unit 400 may select an image, in which average brightness of the scribe region 15 included therein is closest to a predetermined value, among the plurality of images captured by the camera 200 and determine the selected image as a wafer image. Based on the wafer image thus selected, the image processing unit 400 may determine whether the wafer W includes a defect.

In some other embodiments, the image processing unit 400 may synthesize a plurality of images to generate a new wafer image, instead of selecting one of the plurality of captured images. This will be described in more detail with reference to FIG. 7.

Figure 7:
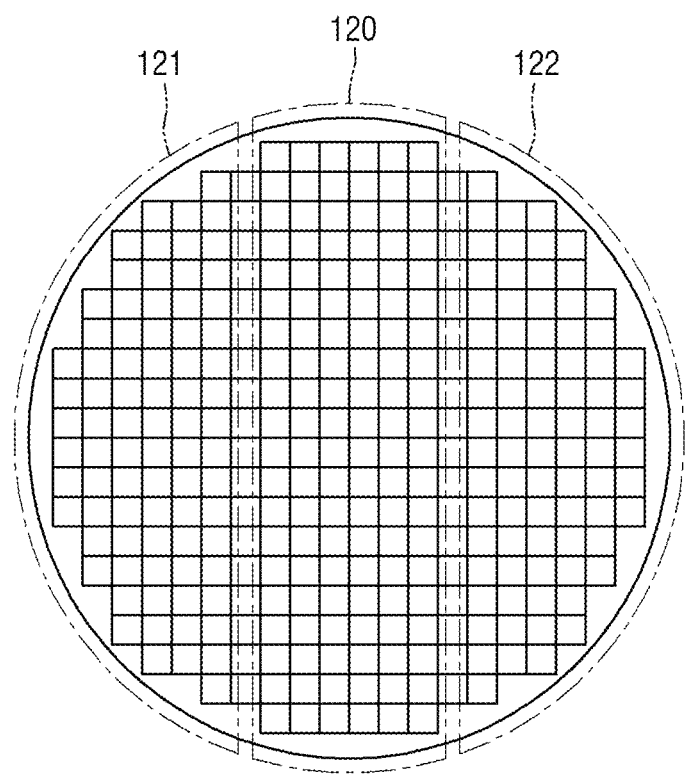
FIG. 7 is a conceptual diagram explaining how a semiconductor manufacturing apparatus according to an exemplary embodiment of the present inventive concept obtains a synthesized image according to divided regions of the wafer.

FIG. 7 is a conceptual diagram explaining how a semiconductor manufacturing apparatus according to an exemplary embodiment of the present inventive concept obtains a synthesized image according to divided regions of the wafer.

Referring to FIG. 7, the image processing unit 400 may divide the surface of the wafer W into a first region 120, a second region 121 and a third region 122. As shown in FIG. 7, the second region 121 and the third region 122 of the wafer W may each correspond to a peripheral region, and the first region 120 may correspond to a central region disposed between the second region 121 and the third region 122.

The image processing unit 400 may synthesize a portion of the first region 120 of the first image, a portion of the second region 121 of the second image, and a portion of the third region 122 of the third image among the plurality of images captured by the camera 200 to generate a fourth image. In an exemplary embodiment, the image processing unit 400 may generate a new fourth image by synthesizing a portion of the first region 120 of the first image captured with the first exposure time, a portion of the second region 121 of the second image captured with the second exposure time, and a portion of the third region 122 of the third image captured with the third exposure time by the camera 200.

As shown in FIGS. 6A to 6C, the image of the wafer W generated by the camera 200 may not be displayed at the same brightness with respect to substantially the entire surface. That is, the ultraviolet light source 300 is positioned below a central portion of the wafer W and ultraviolet light transmitted through the central portion, e.g., the first region 120, of the wafer W may be concentrated due to the diffraction of the ultraviolet light generated inside the wafer W. Accordingly, an image captured by the camera 200 may also be generated such that the brightness of the central portion of the wafer is high.

In this case, when the image capturing is performed by raising the exposure time of the camera 200 to determine whether a defect exists in a region, e.g., the second region 121 or the third region 122 of the wafer W, in which the transmitted ultraviolet light is not relatively concentrated, the image of the first region 120 may have excessively high brightness, that is, an over-saturated image may be formed.

To solve this problem, the camera 200 generates a first image of the wafer W captured with the first exposure time, generates a second image of the wafer W captured with the second exposure time, and generates a third image of the wafer W captured with the third exposure time. The image processing unit 400 may select a portion of the first region 120 of the first image, select a portion of the second region 121 of the second image, select a portion of the third region 122 of the third image, and synthesize the images of the selected regions to generate a fourth image.

Figure 8:
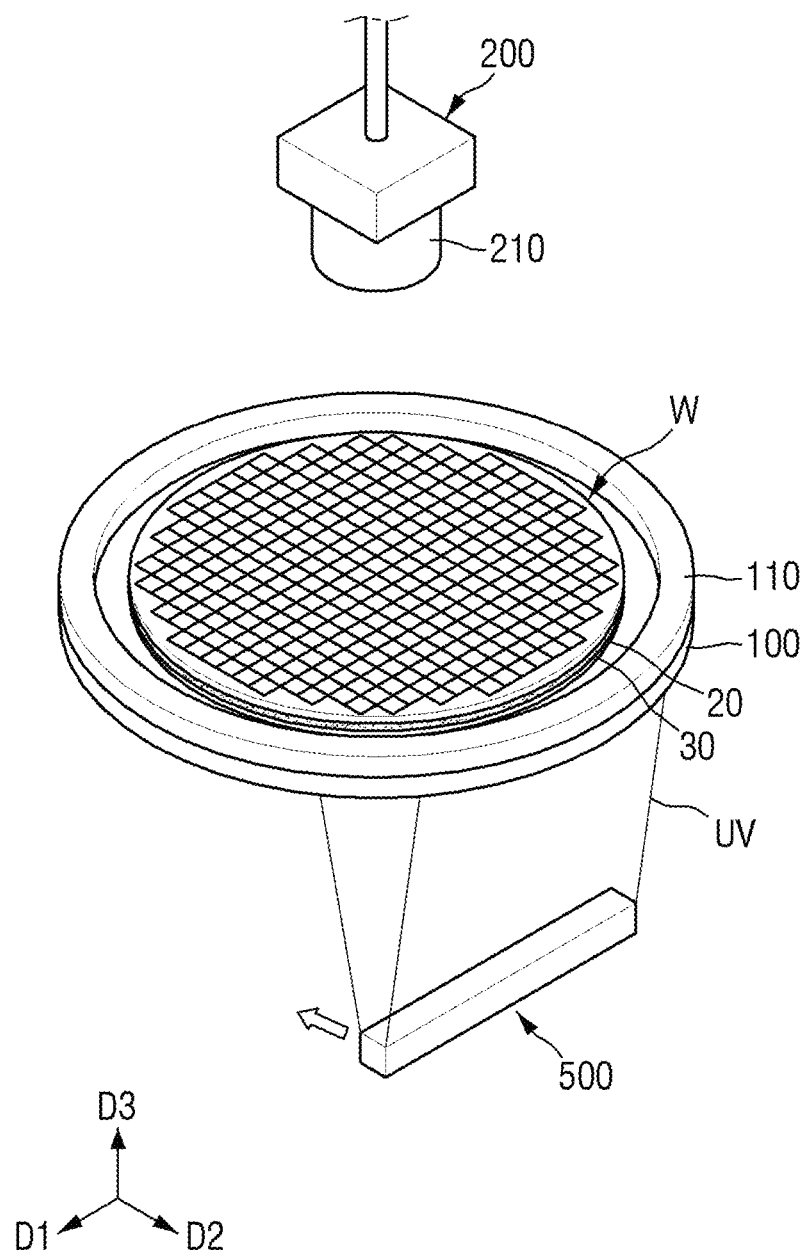
FIG. 8 is a partial perspective view of a semiconductor manufacturing apparatus according to an exemplary embodiment of the present inventive concept.
Figure 9:
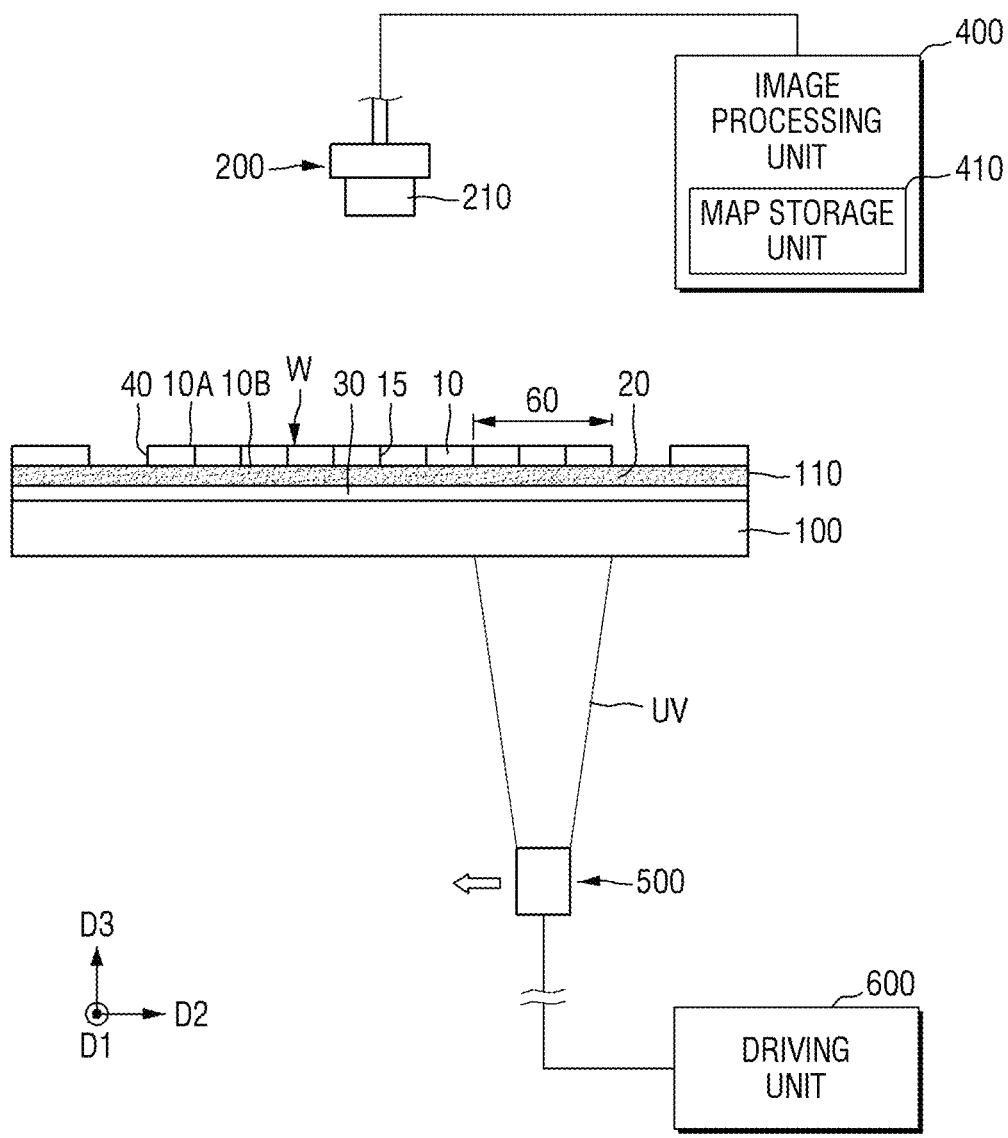
FIG. 9 is a conceptual diagram illustrating a semiconductor manufacturing apparatus according to an exemplary embodiment of the present inventive concept.

FIG. 8 is a partial perspective view of a semiconductor manufacturing apparatus according to an exemplary embodiment of the present inventive concept. FIG. 9 is a conceptual diagram illustrating the semiconductor manufacturing apparatus of FIG. 8. Hereinafter, a repeated description similar to the above-described embodiments will be omitted and differences will be mainly described.

Referring to FIGS. 8 and 9, a semiconductor manufacturing apparatus according to an exemplary embodiment of the present inventive concept may include, among other components, the loading unit 100, the camera 200, and an ultraviolet light source 500.

In the embodiment shown in FIG. 8, the ultraviolet light source 500 may be different from the ultraviolet light source 300 included in the above-described embodiment. In an exemplary embodiment, the ultraviolet light source 500 may have a rod shape extending along a first direction D1. That is, the ultraviolet light source 500 may emit ultraviolet light (UV) from a rod-shaped light source having a relatively long side extending along the first direction D1 and a relatively short side extending along a second direction D2 perpendicular to the first direction D1.

Of course, a region of the wafer W or the die attach film 30 to which ultraviolet light (UV) is irradiated does not have a rectangular shape due to various factors such as the scattering of ultraviolet light (UV) in the air. However, the shape of the ultraviolet irradiation region on the first surface of the wafer W may be somewhat similar to the shape of the ultraviolet light source 500.

Therefore, if the ultraviolet light source 300 irradiates substantially the entire area of the first surface of the wafer W with ultraviolet light (UV) in the semiconductor manufacturing apparatus according to the previous embodiment, the ultraviolet light source 500 irradiates ultraviolet light (UV) onto a partial region (e.g., region 50) on the first surface of the wafer W.

The ultraviolet light (UV) irradiated by the ultraviolet light source 500 may be irradiated onto the ultraviolet sensitive layer 20 and the die attach film 30, as in the embodiments described above. Therefore, the ultraviolet light (UV) emitted from the ultraviolet light source 500 is irradiated onto only a partial region (e.g., region 50) of the ultraviolet sensitive layer 20, and only the adhesive strength of a partial region of the die attach film 30 attached to the wafer W may be weakened.

Further, the ultraviolet light source 500 may be connected to a driving unit 600. The driving unit 600 may move the ultraviolet light source 500 along the second direction D2 perpendicular to the first direction D1. The ultraviolet light source 500 may irradiate the first surface of the wafer W with ultraviolet light (UV) while moving along the second direction D2.

Since the ultraviolet light (UV) emitted from the ultraviolet light source 500 is used not only for the image capturing of the camera 200, but also for weakening the adhesive strength of the ultraviolet sensitive layer 20 included in the die attach film 30, the ultraviolet light source 500 may irradiate ultraviolet light (UV) onto the die attach film 30 and the wafer W for a sufficient time at one position.

The operation of the semiconductor manufacturing apparatus according to the present embodiment will be described in more detail with reference to FIG. 10.

Figure 10:
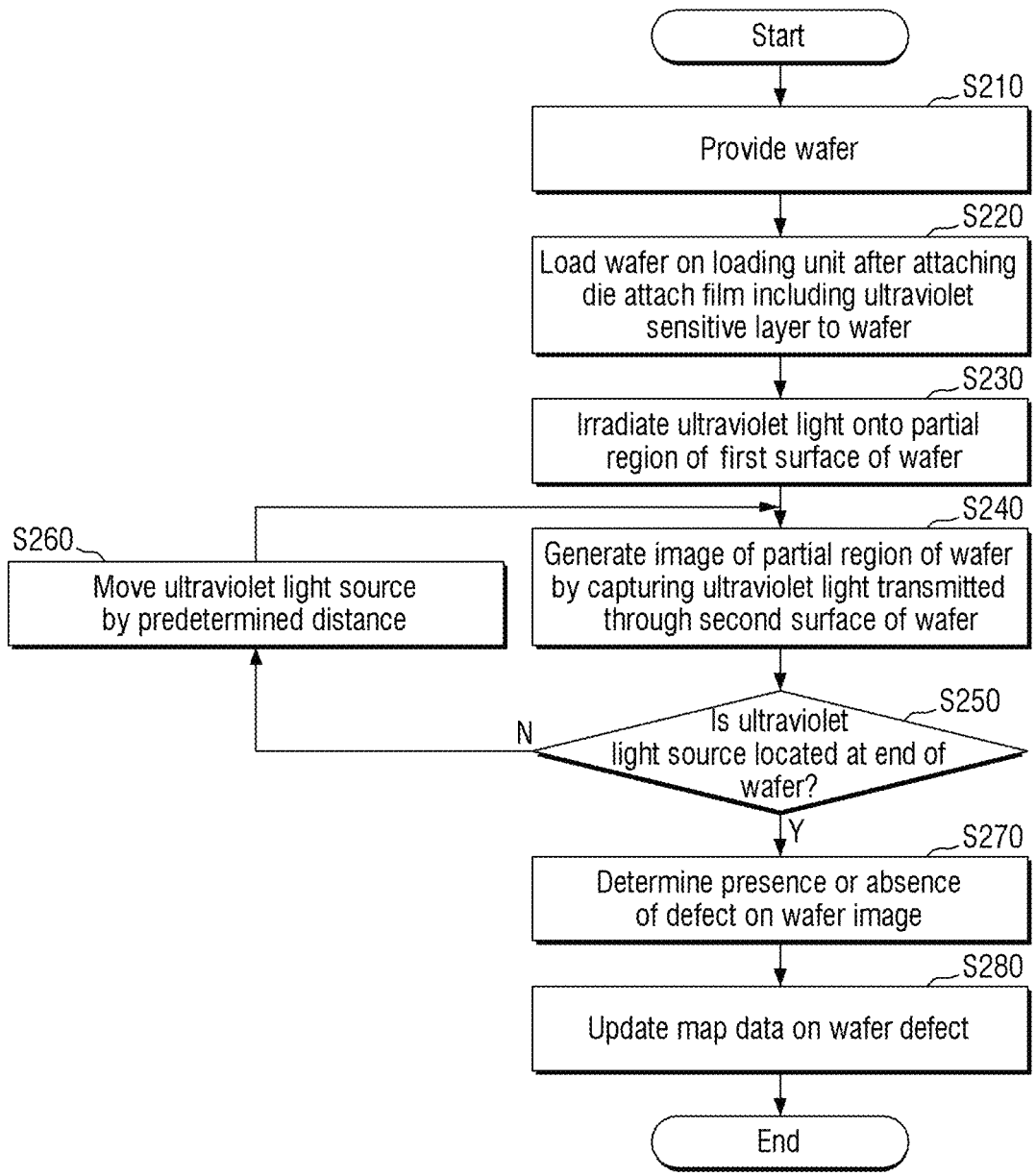
FIG. 10 is a flowchart explaining an operation of a semiconductor manufacturing apparatus according to an exemplary embodiment of the present inventive concept disclosure.

FIG. 10 is a flowchart explaining an operation of a semiconductor manufacturing apparatus according to an exemplary embodiment of the present inventive concept.

Referring to FIG. 10, a method of manufacturing a semiconductor device using a semiconductor manufacturing apparatus according to an exemplary embodiment of the present inventive concept includes providing a wafer W in which a plurality of semiconductor devices 10 are separated by the scribe region 15 (S210), attaching the die attach film 30 including the ultraviolet sensitive layer 20 to the wafer W and loading it on the loading unit 100 (S220), irradiating ultraviolet light (UV) onto the first surface of the wafer W (S230), and generating an image of the wafer W by capturing the ultraviolet light transmitted through the second surface of the wafer W (S240). The method further includes determining whether the current position of the ultraviolet light source 500 is located at the end of the wafer W (S250), moving the ultraviolet light source 500 by a predetermined distance if the ultraviolet light source 500 is not located at the end of the wafer W (S260), determining whether a defect is present on the image of the wafer W if the ultraviolet light source 500 is located at the end of the wafer W (S270), and updating the map data regarding whether the wafer W is defective (S280). In an exemplary embodiment, the semiconductor manufacturing method using a semiconductor manufacturing apparatus according to an exemplary embodiment of the present inventive concept is performed in the same way as the semiconductor manufacturing method described above with reference to FIG. 3 from the start to the loading step (S120) of the wafer W.

Then, the ultraviolet light source 500 irradiates ultraviolet light (UV) onto the first surface of the wafer W (S230). Since the ultraviolet light source 500 has a rod shape elongated along the first direction D1 as described above, the wafer W and the die attach film 30 may also have an ultraviolet radiation region formed in a shape elongated along the first direction D1.

Figure 11:
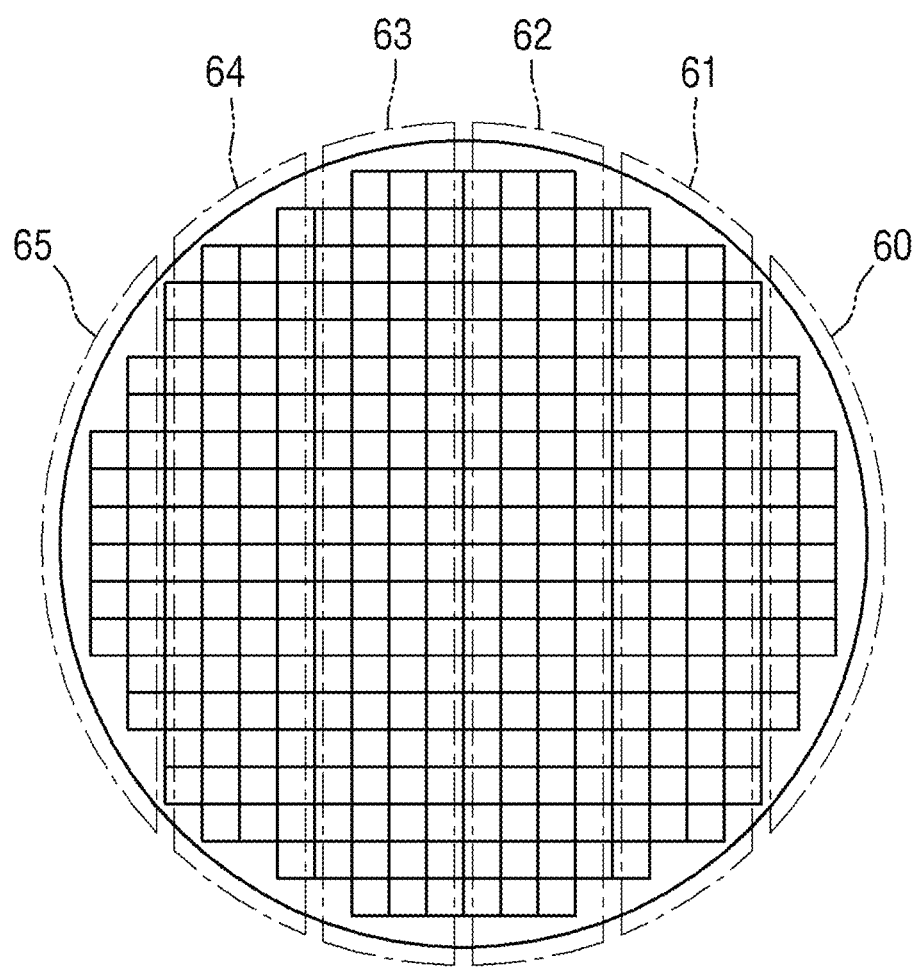
FIG. 11 is a conceptual diagram explaining how a semiconductor manufacturing apparatus according to an exemplary embodiment of the present inventive concept obtains a synthesized image according to an exemplary embodiment of the present inventive concept.

The camera 200 generates an image of a partial region of the wafer by capturing ultraviolet light (UV) transmitted through the second surface of the wafer W (S240). With reference to FIG. 11, a more detailed description will be given with respect to generation of a wafer image by the camera 200 and the image processing unit 400.

FIG. 11 is a conceptual diagram explaining how a semiconductor manufacturing apparatus according to an exemplary embodiment of the present inventive concept obtains a synthesized image according to divided regions of the wafer.

Referring to FIG. 11, the second surface of the wafer W is shown as being divided into a first region 60, a second region 61, a third region 62, a fourth region 63, a fifth region 64, and a sixth region 65, for example. As described above, the ultraviolet irradiation region of the wafer W by the ultraviolet light source 500 is not precisely divided into the first region 60, the second region 61, the third region 62, the fourth region 63, the fifth region 64, and the sixth region 65 as shown in FIG. 11. The first region 60, the second region 61, the third region 62, the fourth region 63, the fifth region 64, and the sixth region 65 are assumed to be regions of the wafer W arbitrarily created or assigned by the image processing unit 400. The image processing unit 400 may process the plurality of images captured by the camera 200 by dividing each of the images into the first region 60, the second region 61, the third region 62, the fourth region 63, the fifth region 64, and the sixth region 65.

For example, the ultraviolet light source 500 may be disposed initially at a position overlapping the first region 60 of the wafer W. The camera 200 may capture a first image when the ultraviolet light source 500 is located at the above-mentioned position. Due to the position of the ultraviolet light source 500, the ultraviolet light that is transmitted to the second surface of the wafer W is concentrated in the first region 60 and the first image of the wafer W captured by the camera 200 may also be generated such that the first region 60 is displayed bright.

The image processing unit 400 may separate and separately store a portion corresponding to the first region 60 of the first image captured by the camera 200. Then, the image processing unit 400 may use an image of the separated region to determine the wafer image.

It is determined whether the current position of the ultraviolet light source 500 is at a position overlapping the end of the wafer W, for example, the sixth region 65 (S250). If not, the ultraviolet light source 500 is moved by a predetermined distance (S260). The driving unit 600 may move the ultraviolet light source 500 to a position overlapping the second region 61, for example.

Then, the ultraviolet light source 500 may irradiate ultraviolet light (UV) onto the first surface of the wafer W at the moved position, and the camera 200 may capture a second image when the ultraviolet light source 500 is located at the above-mentioned position. The image processing unit 400 may separate and separately store a portion corresponding to the second region 61 from the second image captured by the camera 200.

Further, the ultraviolet light (UV) emitted from the ultraviolet light source 500 may weaken the adhesive strength of the region on the die attach film 30 which overlaps the second region 61 of the wafer W.

Through the above-described process, the ultraviolet light source 500 may continue to move along the second direction D2 and be disposed at a position overlapping the sixth region 65 of the wafer W. The camera 200 may capture a sixth image of the wafer W and the image processing unit 400 may separately store a portion corresponding to the sixth region 65 from the sixth image.

If the current position of the ultraviolet light source 500 corresponds to the end of the wafer W and it is not necessary for the ultraviolet light source 500 to move further, the image processing unit 400 determines a wafer image to determine the presence or absence of a defect in the wafer image (S270).

The image processing unit 400 may generate a seventh image by synthesizing portions of the wafer image corresponding to the first region 60, the second region 61, the third region 62, the fourth region 63, the fifth region 64, and the sixth region 65, and determine the seventh image as a wafer image. In addition, irradiation of ultraviolet light (UV) onto substantially the entire surface of the die attach film 30 may be completed, thereby completing the process of weakening the adhesive strength of the ultraviolet sensitive layer 20.

The image processing unit 400 determines whether the wafer W contains a defect in the same manner as in the above-described embodiments, and thus, a description thereof will be omitted.

Figure 12:
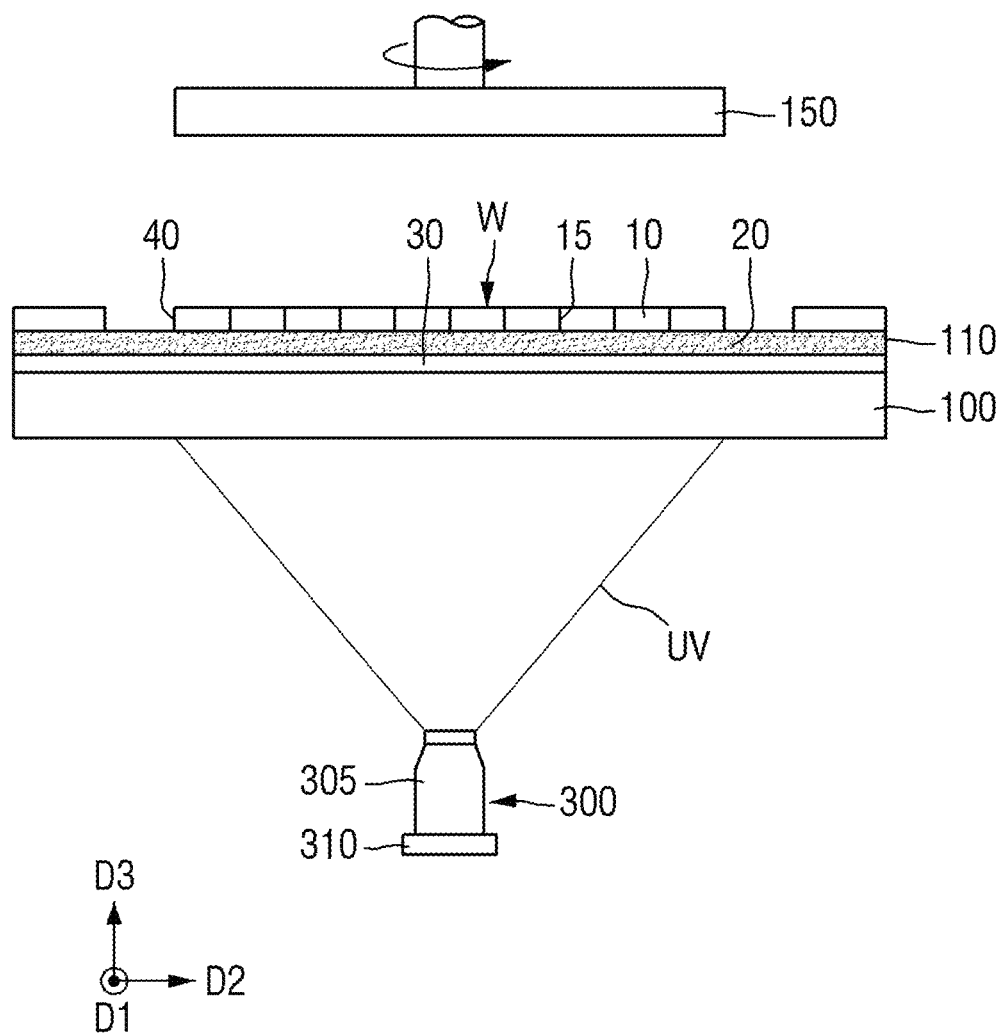
FIG. 12 is a conceptual diagram explaining a semiconductor manufacturing apparatus according to an exemplary embodiment of the present inventive concept.

FIG. 12 is a conceptual diagram explaining a semiconductor manufacturing apparatus according to an exemplary embodiment of the present inventive concept.

Referring to FIG. 12, a semiconductor manufacturing apparatus according to an exemplary embodiment of the present inventive concept may include a grinder 150. The grinder 150 may reduce the thickness of the wafer W by grinding the second surface of the wafer W. The grinding process by the grinder 150 may be performed after physically damaging the wafer W along the scribe region 15 with a laser. In this case, a GAL process may be performed on the surface of the wafer W by the grinder 150.

Alternatively, a back lap (B/L) process may be performed on the wafer W by the grinder 150 without laser processing.

After the grinding process by the grinder 150 is completed, the process described above with reference to FIGS. 1 to 11 may be performed. In an exemplary embodiment, before separating the plurality of semiconductor devices 10 included in the wafer W ground by the grinder 150 from the die attach film 30, the above-described processes may be performed on the wafer W to weaken the adhesive strength of the ultraviolet sensitive layer 20 and to inspect a defect on the wafer W due to the grinding process or physical damage.

Figure 13:
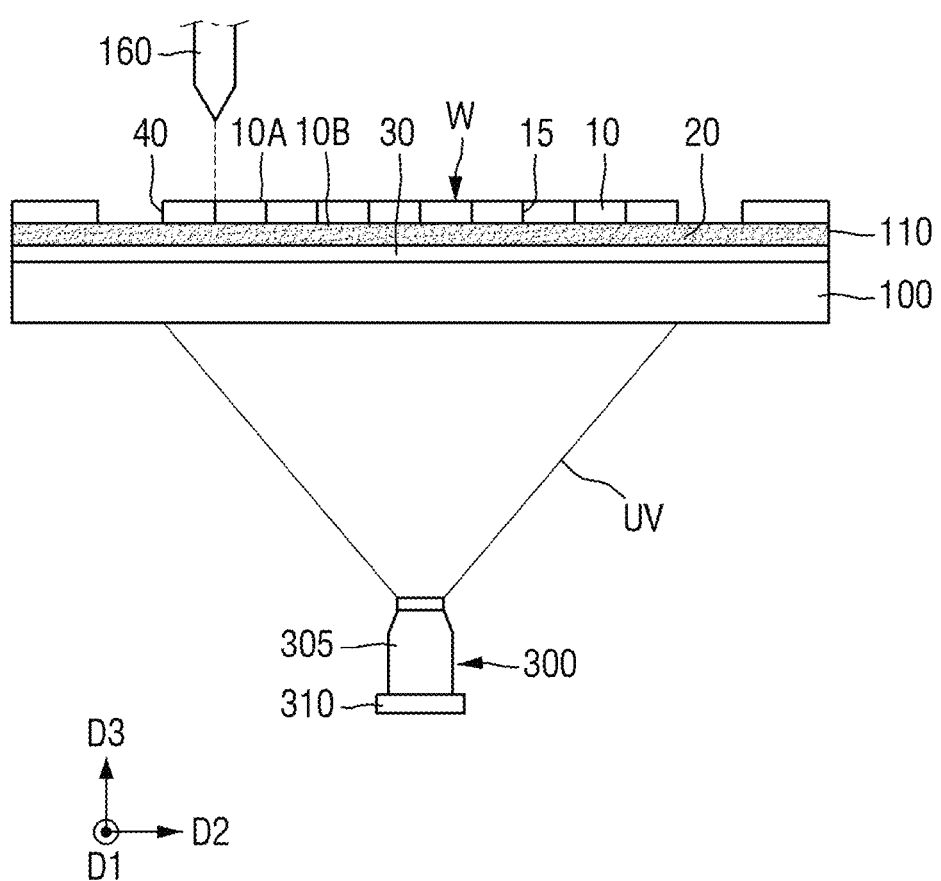
FIG. 13 is a conceptual diagram explaining a semiconductor manufacturing apparatus according to an exemplary embodiment of the present inventive concept.

FIG. 13 is a conceptual diagram explaining a semiconductor manufacturing apparatus according to an exemplary embodiment of the present inventive concept.

Referring to FIG. 13, a semiconductor manufacturing apparatus according to an exemplary embodiment of the present inventive concept may include a blade 160 which performs a sawing process.

The blade 160 may separate the wafer W into individual semiconductor devices 10 by cutting the wafer W along the scribe region 15. After the sawing process is performed, the process described above with reference to FIGS. 1 to 11 may be performed. In an exemplary embodiment, before the sawed semiconductor devices 10 are separated from the die attach film 30, the above-described processes may be performed on the wafer W to weaken the adhesive strength of the ultraviolet sensitive layer 20 and to inspect a defect on the wafer W due to the sawing process.

Figure 14:
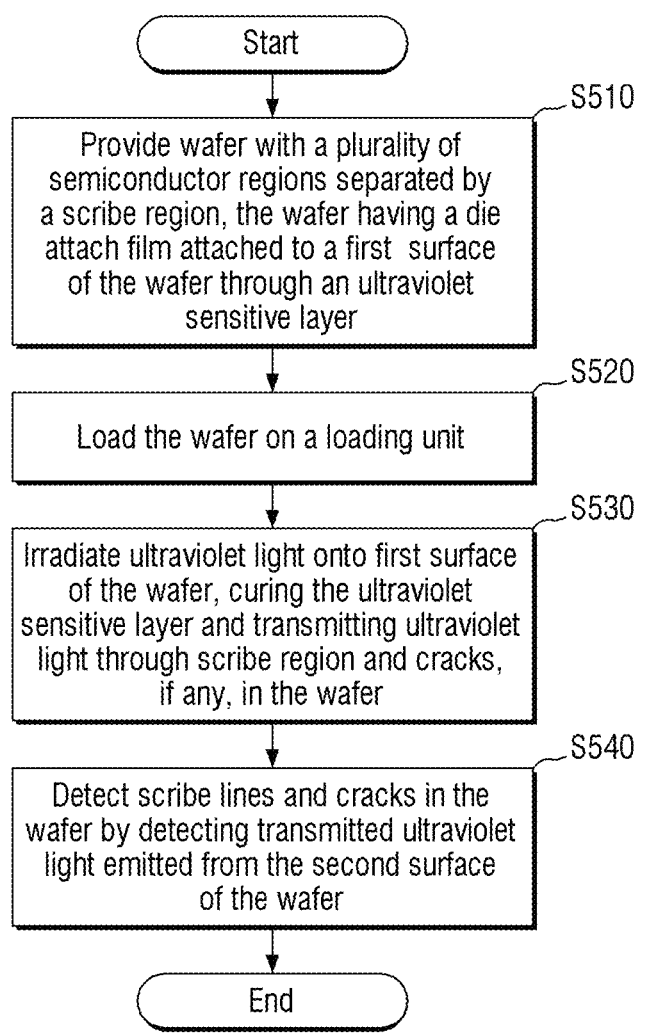
FIG. 14 is a flowchart explaining an operation of a semiconductor manufacturing apparatus according to an exemplary embodiment of the present inventive concept.

In addition, FIG. 14 illustrates an operation of a semiconductor manufacturing apparatus according to an exemplary embodiment of the present inventive concept. Here, a wafer on which a plurality of semiconductor devices are separated by a scribe region is provided (S510). The wafer includes a die attach film attached to a first surface of the wafer through an ultraviolet sensitive layer. Then, the wafer is loaded on a loading unit (S520). Next, the first surface of the wafer is irradiated with ultraviolet light to cure the ultraviolet sensitive layer and to transmit through a scribe region and cracks, if any, in the wafer (S530) and, as a result, defects can be detected (inspection) in the wafer using the ultraviolet light transmitted through a second surface of the wafer opposite to the first surface of the wafer (S540). In this embodiment, the processing steps of S530 and 540 may be performed almost at the same time as soon as the ultraviolet light transmits through the second surface. In some embodiments, the inspection can be performed by a human operator.

The exemplary embodiments of the present inventive concept have been described with reference to the attached drawings, but it may be understood by one of ordinary skill in the art that the present inventive concept may be performed one of ordinary skill in the art in other specific forms without changing the technical concept or essential features of the present inventive concept. Further, the above-described embodiments are merely examples and do not limit the scope of the rights of the inventive concept.

What is claimed is:

1. A semiconductor manufacturing apparatus, comprising:
a loading unit configured to load a wafer having a first surface to which a die attach film is attached through an ultraviolet sensitive layer;
an ultraviolet light source configured to irradiate ultraviolet light onto the first surface of the wafer attached to the die attach film; and
a camera configured to generate a wafer image by capturing ultraviolet light transmitted through a second surface of the wafer opposite to the first surface of the wafer,
wherein the camera is configured to generate a first wafer image with a first exposure time, and generate a second wafer image with a second exposure time longer than the first exposure time.

2. The semiconductor manufacturing apparatus of claim 1, further comprising an image processing unit configured to process the wafer image generated by the camera.

3. The semiconductor manufacturing apparatus of claim 2, wherein the wafer includes a plurality of semiconductor devices and a scribe region for separating the plurality of semiconductor devices, and
the image processing unit is configured to determine whether a defect exists in the plurality of semiconductor devices from the wafer image.

4. The semiconductor manufacturing apparatus of claim 3, wherein the image processing unit is configured to receive map data regarding whether a defect exists in the plurality of semiconductor devices, and
update the map data according to whether a defect is formed in the plurality of semiconductor devices.

5. The semiconductor manufacturing apparatus of claim 2, wherein the image processing unit is configured to synthesize the first wafer image and the second wafer image to generate a third wafer image, and
determine whether a defect exists in a plurality of semiconductor devices based on the third wafer image.

6. The semiconductor manufacturing apparatus of claim 2, wherein the image processing unit is configured to select one of the first wafer image and the second wafer image, and
determine whether a defect exists in a plurality of semiconductor devices based on the selected wafer image.

7. The semiconductor manufacturing apparatus of claim 2, wherein the ultraviolet light source has a rectangular shape including a relatively long side extending along a first direction and a relatively short side extending along a second direction perpendicular to the first direction.

8. The semiconductor manufacturing apparatus of claim 7, wherein the camera is configured to generate a first wafer image when the ultraviolet light source is disposed to irradiate the ultraviolet light at a first position, and generate a second wafer image when the ultraviolet light source is disposed at a second position to which the ultraviolet light source has moved in the second direction.

9. The semiconductor manufacturing apparatus of claim 8, wherein the image processing unit is configured to synthesize the first wafer image and the second wafer image to generate a third wafer image.

10. A semiconductor manufacturing apparatus, comprising:

an ultraviolet light source configured to irradiate ultraviolet light onto a first surface of a wafer on which a plurality of semiconductor devices separated by a scribe region are formed and to which a die attach film is attached through an ultraviolet sensitive layer;

a camera configured to generate a wafer image by capturing an image formed by ultraviolet light transmitted through a second surface of the wafer opposite to the first surface of the wafer; and an image processing unit configured to receive the wafer image and determine whether a defect exists in the plurality of semiconductor devices from the wafer image, wherein the wafer includes a plurality of regions arranged side by side in one direction to divide the second surface of the wafer, the plurality of regions include a first region and a second region adjacent to each other, the ultraviolet light source is configured to irradiate the ultraviolet light onto the first region, and then move and irradiate the ultraviolet light onto the second region, and the image processing unit is configured to generate a wafer image synthesized from a wafer image for the first region and a wafer image for the second region.

11. The semiconductor manufacturing apparatus of claim 10, wherein the image processing unit is configured to store map data regarding whether a defect exists in the plurality of semiconductor devices, and update the map data according to whether a defect is formed in the plurality of semiconductor devices.

12. The semiconductor manufacturing apparatus of claim 10, wherein the camera is configured to generate a first wafer image with a first exposure time, and generate a second wafer image with a second exposure time longer than the first exposure time.

13. A method of manufacturing a semiconductor device, comprising:

providing a wafer on which a plurality of semiconductor devices are separated by a scribe region;

attaching a die attach film having an ultraviolet sensitive layer to a first surface of the wafer and loading the wafer on a loading unit;

irradiating ultraviolet light onto the first surface of the wafer to cure the ultraviolet sensitive layer;

obtaining an image of the wafer by capturing ultraviolet light transmitted through a second surface of the wafer opposite to the first surface of the wafer;

wherein the obtaining the image of the wafer includes generating a first wafer image with a first exposure time, and generating a second wafer image with a second exposure time longer than the first exposure time.

14. The semiconductor manufacturing method of claim 13, wherein providing the wafer comprises:

irradiating a laser beam onto the wafer along the scribe region; and grinding the second surface of the wafer.

15. The semiconductor manufacturing method of claim 13, further comprising determining whether a defect exists in the plurality of semiconductor devices from the wafer image.

16. The semiconductor manufacturing method of claim 15, further comprising receiving map data indicating whether a defect exists in the plurality of semiconductor devices, and updating the map data according to whether a defect is formed in the plurality of semiconductor devices.

* * * * *